(12) United States Patent
Wu et al.

(10) Patent No.: US 12,408,540 B2
(45) Date of Patent: Sep. 2, 2025

(54) DISPLAY DEVICE AND METHOD FOR PREPARING SAME

(71) Applicants: HUIZHOU CHINA STAR OPTOELECTRONICS DISPLAY CO., LTD, Huizhou (CN); SHENZHEN CHINA STAR OPTOELECTRONICS SEMICONDUCTOR DISPLAY TECHNOLOGY CO., LTD., Shenzhen (CN)

(72) Inventors: Jiejie Wu, Huizhou (CN); Liuxi Jiang, Huizhou (CN)

(*) Notice: Subject to any disclaimer, the term of this patent is extended or adjusted under 35 U.S.C. 154(b) by 0 days.

(21) Appl. No.: 17/599,574

(22) PCT Filed: Jul. 22, 2021

(86) PCT No.: PCT/CN2021/107948
§ 371 (c)(1),
(2) Date: Sep. 29, 2021

(87) PCT Pub. No.: WO2023/283990
PCT Pub. Date: Jan. 19, 2023

(65) Prior Publication Data
US 2024/0032407 A1     Jan. 25, 2024

(30) Foreign Application Priority Data
Jul. 14, 2021   (CN) .......................... 202110795166.7

(51) Int. Cl.
*H10K 59/80*    (2023.01)
*H10K 59/12*    (2023.01)
*H10K 102/00*   (2023.01)

(52) U.S. Cl.
CPC ..... *H10K 59/8792* (2023.02); *H10K 59/1201* (2023.02); *H10K 59/872* (2023.02); *H10K 2102/351* (2023.02)

(58) Field of Classification Search
CPC .......... H01L 29/78633; H01L 27/3272; H10K 50/86; H10K 59/8792
See application file for complete search history.

(56) References Cited

U.S. PATENT DOCUMENTS

| | | | |
|---|---|---|---|
| 2002/0093284 A1* | 7/2002 | Adachi | H10K 59/8791 313/506 |
| 2004/0080267 A1* | 4/2004 | Cok | G06F 3/0412 313/512 |

(Continued)

FOREIGN PATENT DOCUMENTS

| | | |
|---|---|---|
| CN | 204480220 U | 7/2015 |
| CN | 208061170 U | 11/2018 |

(Continued)

OTHER PUBLICATIONS

Sumerel, "Ink Jet Printing Adhesives", 2006 (Year: 2006).*

*Primary Examiner* — Britt D Hanley
*Assistant Examiner* — Casey Paul Boatman

(57) ABSTRACT

Embodiments of the present disclosure provide a display device and a method for preparing same. According to the display device provided in the embodiments of the present disclosure, a groove is provided in a second non-display area of a packaging cover plate, and a light-shielding layer is disposed in the groove. The light-shielding layer can shield metal traces in a first non-display area of a display panel. In this way, a problem of reflection of the metal traces in the first non-display area of the display panel is resolved, thereby enhancing visual perception and an all-black effect of the display panel.

20 Claims, 5 Drawing Sheets

(56) References Cited

U.S. PATENT DOCUMENTS

| | | | | |
|---|---|---|---|---|
| 2005/0019585 A1* | 1/2005 | Kashiwagi | ........... | H10K 50/844 |
| | | | | 428/917 |
| 2010/0033660 A1 | 2/2010 | Yamada | | |
| 2021/0257583 A1* | 8/2021 | Park | ........ | H10K 50/87 |
| 2021/0408454 A1* | 12/2021 | He | ......... | H10K 59/88 |

FOREIGN PATENT DOCUMENTS

| | | | | | |
|---|---|---|---|---|---|
| CN | 107393907 B | * | 6/2019 | ............ | H01L 23/60 |
| CN | 111367117 A | | 7/2020 | | |
| CN | 111445790 A | | 7/2020 | | |
| CN | 111766977 A | | 10/2020 | | |
| CN | 112002223 A | | 11/2020 | | |
| CN | 212967755 U | * | 4/2021 | | |
| CN | 112820839 A | | 5/2021 | | |
| JP | 2016224220 A | | 12/2016 | | |

\* cited by examiner

DISPLAY DEVICE AND METHOD FOR PREPARING SAME

FIELD OF INVENTION

The present disclosure relates to the field of display technologies, and in particular, to a display device and a method for preparing same.

BACKGROUND OF INVENTION

An organic light-emitting diode (OLED) display panel is a display panel made using an organic light-emitting diode. The OLED display panel is considered as an emerging application technology of a flat panel display of the next generation due to its excellent characteristics such as no need for backlight, high contrast, a small thickness, a wide viewing angle, a fast response speed, a wide range of application temperatures, a simple structure and process, and the like.

SUMMARY OF INVENTION

Technical Problem

An OLED display panel includes a rigid OLED display panel and a flexible OLED display panel. At present, the rigid OLED display panel mostly adopts transparent glass to package a device layer to achieve an effect of blocking oxygen and water vapor. However, since the glass is transparent, metal traces on a bottom array base plate (that is, a thin film transistor 20 array base plate) can be obviously seen in a non-display area of the display panel. The metal traces are still visible to naked eyes even after a polarizer is attached, and especially light can be reflected in an environment with strong natural light, which seriously affects an appearance display effect and an all-black effect of the OLED display panel.

Technical Solution

Embodiments of the present disclosure provide a display device and a method for preparing same. In this way, a problem of reflection of metal traces in a non-display area of a display panel can be resolved, thereby enhancing visual perception and an all-black effect of the display panel.

The embodiment of the present disclosure provides a display device. The display device includes a display panel and a packaging cover plate that are disposed opposite to each other. The display panel includes a first display area and a first non-display area disposed on a periphery of the first display area. The packaging cover plate includes a second display area and a second non-display area disposed on a periphery of the second display area. The first display area corresponds to the second display area, and the first non-display area corresponds to the second non-display area. A groove is provided in the second non-display area, and a light-shielding layer is disposed in the groove.

Beneficial Effects

According to the display device provided in the embodiments of the present disclosure, a groove is provided in a second non-display area of a packaging cover plate, and a light-shielding layer is disposed in the groove. The light-shielding layer can shield metal traces in a first non-display area of a display panel. In this way, a problem of reflection of the metal traces in the first non-display area of the display panel is resolved, thereby enhancing visual perception and an all-black effect of the display panel.

BRIEF DESCRIPTION OF DRAWINGS

To describe the technical solutions in the embodiments of the present disclosure more clearly, the following briefly describes the accompanying drawings required for describing the embodiments. Obviously, the accompanying drawings in the following descriptions are merely some embodiments of the present disclosure, and a person of ordinary skill in the art can further obtain other accompanying drawings according to the accompanying drawings without creative efforts.

For a more complete understanding of the present disclosure and beneficial effects thereof, the present disclosure is described below with reference to the accompanying drawings. In the following descriptions, same parts are denoted by same reference numerals.

DETAILED DESCRIPTION OF PREFERRED EMBODIMENTS

The technical solutions of the embodiments of the present disclosure are clearly and completely described in the following with reference to the accompanying drawings of the embodiments of the present disclosure. Apparently, the described embodiments are merely some but not all of the embodiments of the present disclosure. All other embodiments obtained by a person skilled in the art based on the embodiments of the present disclosure without creative efforts shall fall within the protection scope of the present disclosure.

Figure 1:
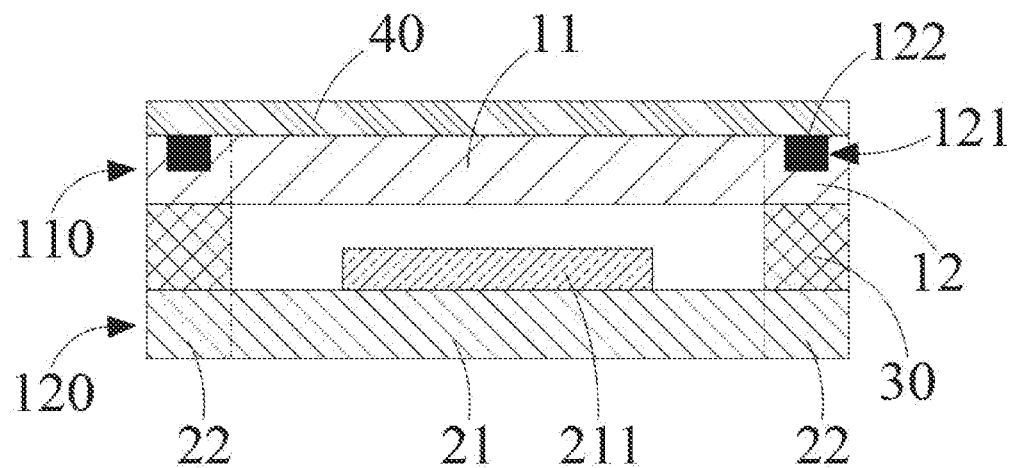
FIG. 1 is a schematic diagram of a first structure of a display device according to an embodiment of the present disclosure.
Figure 2:
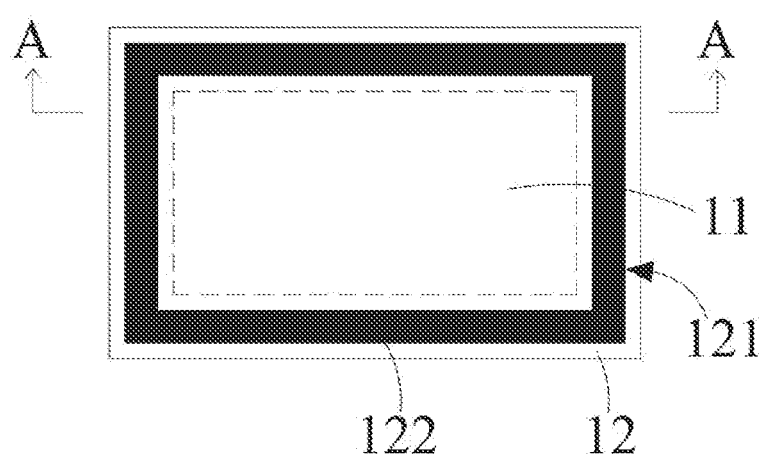
FIG. 2 is a schematic top view of a packaging cover plate according to an embodiment of the present disclosure.
Figure 3:
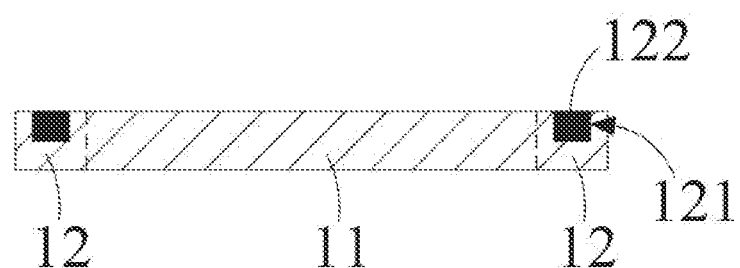
FIG. 3 is a schematic diagram of a cross-sectional structure of a packaging cover plate taken along direction A-A of FIG. 2.

An embodiment of the present disclosure provides a display device. Referring to FIGS. 1 to 3, FIG. 1 is a schematic diagram of a first structure of a display device according to an embodiment of the present disclosure, FIG. 2 is a schematic top view of a packaging cover plate according to an embodiment of the present disclosure, and FIG. 3 is a schematic cross-sectional view of the packaging cover plate according to an embodiment of the present disclosure. The display device 100 includes a display panel 120 and a packaging cover plate 110 that are disposed opposite to each other. The display panel 120 includes a first display area 21 and a first non-display area 22 disposed on a periphery of the first display area 21. The packaging cover plate includes a second display area 11 and a second non-display area 12 disposed on a periphery of the second display area 11. The first display area 21 corresponds to the second display area 11, and the first non-display area 22 corresponds to the second non-display area 12. A groove 121 is provided in the second non-display area, and a light-shielding layer 122 is disposed in the groove 121.

It can be understood that, the packaging cover plate 110 is configured to package the display panel 120 to isolate water, oxygen, and dust, thereby prolonging a service life of the display panel 120.

For example, the display device 100 can be a tablet computer, a notebook computer, a display, a television, and the like.

The display panel 120 can be an OLED display panel. For example, the display panel 120 can be a rigid OLED display panel, and a substrate of the rigid OLED display panel is generally a glass base plate and is hard to bend. For example, the display panel 120 can also be a flexible OLED display panel. The flexible OLED display panel usually refers to a bendable and foldable display panel with good flexibility, and a substrate of the flexible OLED display panel is generally a plastic base plate.

Metal traces are usually disposed in the first non-display area 22 of the display panel 120. Therefore, there is a problem of reflection of the metal traces. According to the display device 100 provided in the embodiment of the present disclosure, the groove 121 is provided in the second non-display area 12 of the packaging cover plate 110, and the light-shielding layer 122 is disposed in the groove 121, so that the light-shielding layer 122 in the packaging cover plate 110 can effectively shield the metal traces in the first non-display area 22 of the display panel 120. In this way, the problem of the reflection of the metal traces in the first non-display area 22 can be resolved, thereby enhancing visual perception and an all-black effect of the display panel 120.

In the related art, in order to resolve the problem of the reflection of the metal traces on the periphery of the display area of the OLED display panel, a solution of a silk-screen printing or transfer printing black frame can be mostly adopted for a small-size OLED. That is, a circle of black ink is printed on a surface of the packaging cover plate using a silk-screen printing or transfer printing method, so as to cover the metal traces on the periphery of the display area. For a medium and large OLED, since a minimum size of the display panel is more than ten inches and a maximum size is more than a hundred inches, silk-screen printing has numerous disadvantages that a halftone of a corresponding size requires to be additionally designed and has a short lifespan, ink is mostly solvent-based ink, curing and ink layer thinning are realized by means of self-volatilization or volatilization of a solvent by baking, overall process efficiency is low, and the silk-screen printing is unfriendly to the environment. Therefore, it is necessary to adopt an ink-jet printing method to print a circle of black ink and perform curing by means of irradiation using ultraviolet light. However, the ink-jet printing method also has a plurality of problems, including the following. 1) An ultra-thin ink layer is required, otherwise a step can be formed between the ink layer and the packaging cover plate, which is bad for attachment of a polarizer, and easily causes problems of bubbles generated between the polarizer and the packaging cover plate. 2) The ink layer is required to have high adhesion, otherwise it can easily fall off the packaging cover plate. It can be seen that, the method of directly spraying and printing the black ink on the packaging cover plate has strict requirements for ink selection, devices, and processes, causing an increase in costs of materials, devices, and processes.

According to the embodiment of the present disclosure, a groove 121 is provided on a packaging cover plate 110, a light-shielding layer 122 is disposed in the groove 121. As a result, technical effects can be achieved as follows. (1) A thickness of the light-shielding layer 122 can be controlled, so that the surface of the packaging cover plate 110 remains flat, which is conducive to attachment of a polarizer 40, thereby avoiding bubbles generated between the polarizer 40 and the packaging cover plate 110 after attachment. (2) Since the light-shielding layer 122 is disposed in the groove 121 and has a relatively low requirement for adhesion of the light-shielding layer 122, the light-shielding layer 122 is not easy to fall off the groove 121. (3) Due to the presence of the groove 121, the thickness of the light-shielding layer 122 can be properly increased to enhance light-shielding performance of the light-shielding layer 122. In the prior art, the method of spraying and printing black ink is to maintain the flatness of the surface of the packaging cover plate 110, and the thickness of an ink layer cannot be too thick. Therefore, the light-shield performance of the ink layer is relatively poor. (4) The solutions of the present disclosure have relatively low requirements for materials, devices, and accuracy of processes, so that process costs are relatively low. (5) A selection range of the light-shielding layer 122 (such as ink or glue) and devices is widened, so as to ensure the safety of supply chains of materials and devices.

For example, a material of the packaging cover plate 110 is glass.

For example, a color of the light-shielding layer 122 is black to achieve a better shielding effect, thereby enhancing an all-black effect of the display device 100.

Referring to FIG. 2, the groove 121 can be provided around the second display area 11 to form a closed-loop structure. For example, the groove 121 can be in a rectangular shape.

For example, an absolute value of a height difference between a top surface of the light-shielding layer 122 and a surface of a side of the packaging cover plate 110 on which the groove 121 is provided is less than 5 μm. For example, an absolute value of a height difference between a top surface of the light-shielding layer 122 and a surface of a side of the packaging cover plate 110 on which the groove 121 is provided can be 4 μm, 3 μm, 2 μm, 1 μm, or 0 μm. Preferably, the height difference between the top surface of the light-shielding layer 122 and a surface of a side of the packaging cover plate 110 on which the groove 121 is provided is 0. That is, the top surface of the light-shielding layer 122 is flush with the surface of the side of the packaging cover plate 110 on which the groove 121 is provided, which facilitates the attachment of the polarizer 40. According to the embodiment of the present disclosure, the groove 121 is provided on the packaging cover plate 110, and the light-shielding layer 122 is disposed in the groove 121, so as to improve the flatness of the surface of the packaging cover plate 110, facilitate the attachment of the polarizer 40, and improve an attachment effect. In this way, bubbles are not easily generated between the polarizer 40 and the packaging cover plate 110 after attachment.

For example, a thickness (H) of the packaging cover plate 110 can be in a range of 100 μm to 1000 μm, and a ratio of a depth (h) of the groove 121 to the thickness (H) of the packaging cover plate 110 can be in a range of 0.01 to 0.1. That is, $0.01\,H \leq h \leq 0.1\,H$. However, in order to guarantee the strength of the packaging cover plate 110, when the thickness (H) of the packaging cover plate 110 is in the range of 500 μm to 1000 μm, the depth (h) of the groove 121 is preferably in the range of 5 μm to 30 μm. When the thickness (H) of the packaging cover plate 110 is in the range of 100 μm to 500 μm, the depth (h) of the groove 121 is preferably in the range of 5 μm to 10 μm.

For example, the distance between the groove 121 and the second display area 11 can be in a range of 100 μm to 400 μm, preferably 100 μm to 200 μm.

For example, the distance between the groove 121 and the outer edge of the second non-display area 12 can be in a range of 100 μm to 200 μm, preferably 100 μm to 150 μm.

For example, the width of the groove 121 can be in a range of 5 mm to 10 mm.

It can be understood that, when the absolute value of the height difference between the top surface of the light-shielding layer 122 and the surface of the side of the packaging cover plate 110 on which the groove 121 is provided is not 0, the top surface of the light-shielding layer 122 can be higher than the surface of the side of the packaging cover plate 110 on which the groove 121 is provided, or can be lower than the surface of the side of the packaging cover plate 110 on which the groove 121 is provided.

For example, the material of the light-shielding layer 122 can be ink or glue. Preferably, the ink is black, and the glue is black.

Figure 7:
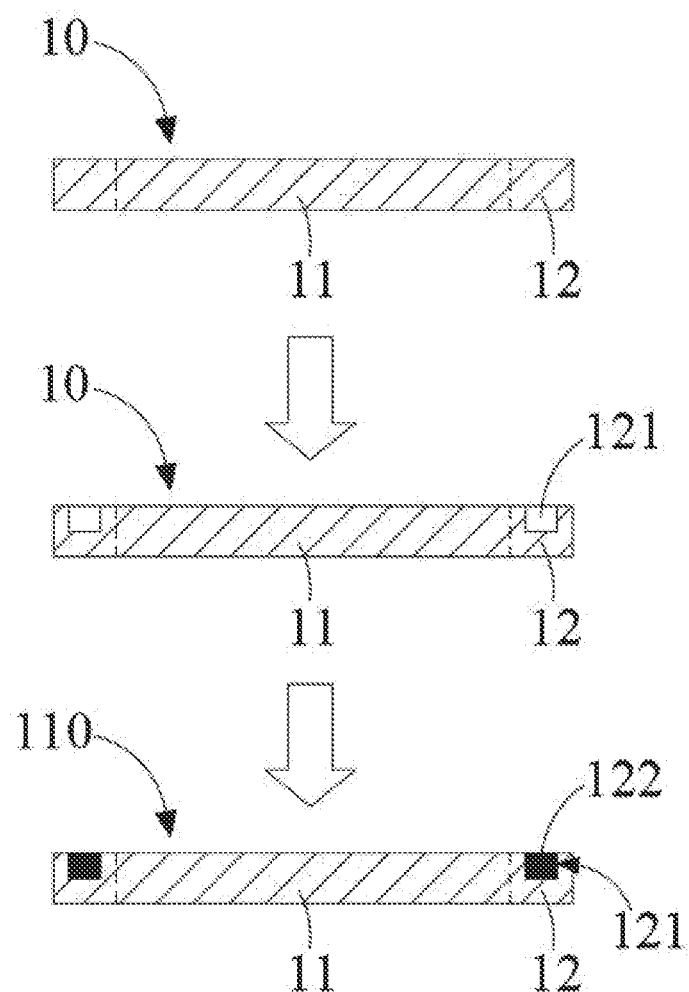
FIG. 7 is a schematic cross-sectional view of each process of the preparation method in FIG. 5.

With reference to FIG. 7, the first non-display area 22 of the display panel 120 can be sealingly connected to the second non-display area 12 of the packaging cover plate 110 using a frame sealing adhesive 30, so as to form a sealed space, thereby preventing an OLED device 211 located in the first display area 21 from being corroded by water, oxygen, and the like.

Referring to FIG. 1, the display device 100 further includes a polarizer 40. The polarizer 40 is disposed on a side of the packaging cover plate 110 that is away from the display panel 120. For example, the polarizer 40 is a circular polarizer.

Figure 4:
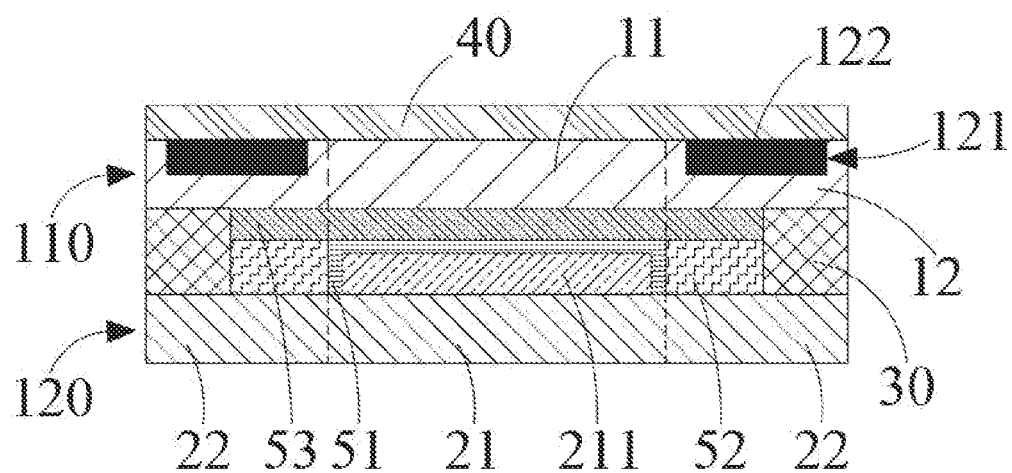
FIG. 4 is a schematic diagram of a second structure of a display device according to an embodiment of the present disclosure.

Referring to FIG. 4, FIG. 4 is a schematic diagram of a second structure of a display device according to an embodiment of the present disclosure. Compared with the display device 100 shown in FIG. 1, in the display device 100 shown in FIG. 4, a thin film encapsulation layer 51 can be further disposed on an outer surface of the OLED device 211 to further isolate water and oxygen. A desiccant 52 can further be disposed in an area formed by the frame sealing adhesive 30 on the display panel 120. The desiccant 52 is disposed on a periphery of the OLED device 211. In addition, filling glue 53 can be further disposed in a sealed space formed by the packaging cover plate 110, the display panel 120, and the frame sealing adhesive 30 in the display device 100. The filling glue 53 covers the OLED device 211 encapsulated by the thin film encapsulation layer 51 and the desiccant 52 and fills the whole sealed space. In this way, the water and oxygen can be further isolated, and the service life of the OLED device 211 can be prolonged.

Figure 5:
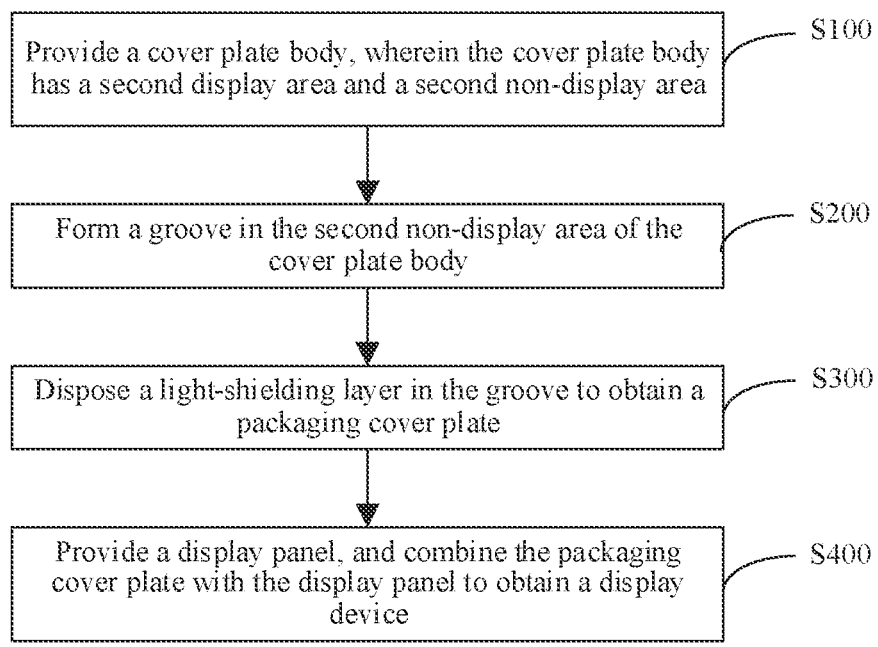
FIG. 5 is a flowchart of a method for preparing a display device according to an embodiment of the present disclosure.
Figure 6:
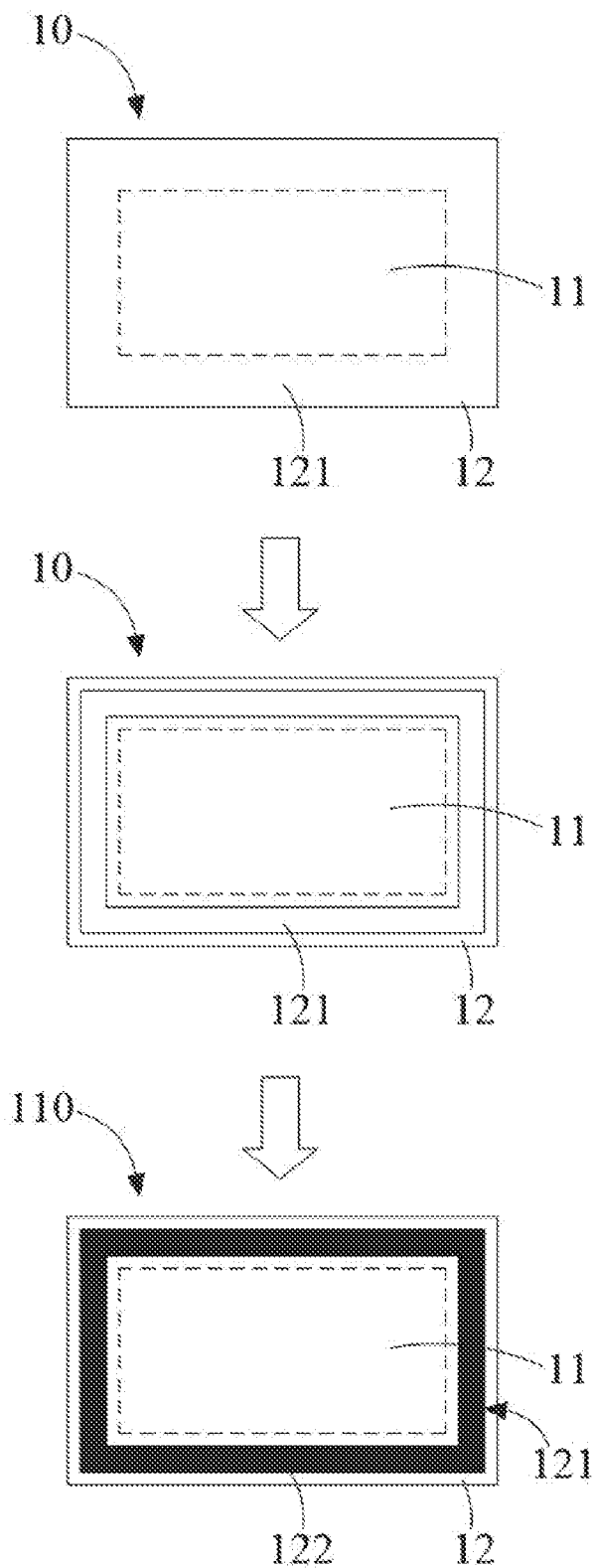
FIG. 6 is a schematic plan view of each process of the preparation method in FIG. 5.

An embodiment of the present disclosure further provides a method for preparing a display device. The display device can be the display device 100 described in any above embodiment. Referring to FIGS. 5 to 7, FIG. 5 is a flowchart of the method for preparing the display device according to an embodiment of the present disclosure, FIG. 6 is a schematic plan view of each process of the preparation method in FIG. 5, and FIG. 7 is a schematic cross-sectional view of each process of the preparation method in FIG. 5. The method for preparing a display device can include steps as follows.

S100: Provide a cover plate body 10, wherein the cover plate body 10 has a second display area 11 and a second non-display area 12.

For example, a material of the cover plate body 10 is glass.

S200: Form a groove 121 in the second non-display area 12 of the cover plate body 10.

When the material of the cover plate body 10 is glass, the forming a groove 121 in the second non-display area 12 of the cover plate body 10 can include in detail: etching the cover plate body 10, so as to form a groove 121 in the second non-display area 12 of the cover plate body 10.

S300: Dispose a light-shielding layer 122 in the groove 121 to obtain a packaging cover plate 110.

In some embodiments, the disposing a light-shielding layer 122 in the groove 121 can include: applying glue in the groove 121 using a glue dispenser.

For example, the glue dispenser can be a piezoelectric ceramic injection valve glue dispenser. A glue dispensing speed is in a range of 50 mm/s to 200 mm/s, and a viscosity of the glue is less than 10000 mPa·s (25° C.).

The glue can be selected from either a single type of black glue or two or more types of glue. For example, the glue can be a combination of the black glue and the glue in other colors or a combination of the black glue and transparent glue. In some embodiments, the glue (can be colorless transparent glue, black glue, or glue in other colors) that can improve the surface property of the groove 121 can be first applied at the bottom of the groove 121, so as to enhance the adhesion of the surface of the groove 121, and then the black glue is applied in the groove 121 to achieve a light-shielding effect.

In some embodiments, the material of the light-shielding layer 122 is glue. The light-shielding layer 122 is disposed in the groove 121. A step of curing the light-shielding layer 122 is further provided. The method of curing is preferably curing by means of irradiation using ultraviolet light. A wave length of the ultraviolet light is in a range of 335 nm to 400 nm, and energy of the ultraviolet light is in a range of 1000 mJ/cm2 to 10000 mJ/cm2. The method of curing can further be moisture curing (20° C. to 25° C., 50% RH to 70% RH) or heat curing (40° C. to 100° C.). A height difference between a surface of a glue layer formed after glue curing and the surface of the cover plate body 10 is less than 5 μm. For example, the height difference between the surface of the glue layer and the surface of the cover plate body 10 is 4 μm, 3 μm, 2 μm, 1 μm, or 0 μm.

In some other embodiments, the disposing a light-shielding layer 122 in the groove 121 can include in detail: spraying ink in the groove 121 using an ink-jet printer.

For example, the ink-jet printer can be a piezoelectric ceramic ink-jet printer, and a viscosity of the ink can be in a range of 10 mPa·s to 20 mPa·s (25° C.).

The ink can be selected from either a single type of black ink or two or more types of ink. For example, the ink can be a combination of the black ink and the ink in other colors or a combination of the black ink and transparent ink. In some embodiments, the ink (can be colorless transparent ink, black ink, or ink in other colors) that can improve the surface property of the groove 121 can be first sprayed at the bottom of the groove 121, so as to enhance the adhesion of the surface of the groove 121, and then the black ink is sprayed in the groove 121 to achieve the light-shielding effect.

The disposing a light-shielding layer 122 in the groove 121 to obtain a packaging cover plate 110 can include in detail: disposing the light-shielding layer 122 in the groove 121, wherein a material of the light-shielding layer 122 is ink, and curing the light-shielding layer 122 to obtain the packaging cover plate 110. The method of curing is preferably curing by means of irradiation using ultraviolet light. A wave length of the ultraviolet light is in a range of 335 nm to 400 nm, and energy of the ultraviolet light is in a range of 500 mJ/cm² to 5000 mJ/cm². The method of curing can further be performing curing while printing, or performing curing after the ink is levelled. After curing, post-processing can be further performed on the ink. That is, baking and heating are performed on the cured ink at a temperature in a range of 40° C. to 100° C., so as to increase the adhesion between an ink layer and the cover plate body 10 and surface hardness of the ink layer. A height difference between the surface of the ink layer formed after curing of the ink and the surface of the cover plate body 10 is less than 5 μm. For example, the height difference between the surface of the ink layer and the surface of the cover plate body 10 is 4 μm, 3 μm, 2 μm, 1 μm, or 0 μm.

S400: Provide a display panel 120, and combine the packaging cover plate 110 with the display panel 120 to obtain the display device 100.

The display device 100 prepared using the above preparation method is shown in FIGS. 1 to 4. Details will not be described herein again.

It should be noted that, in FIG. 1, FIG. 2, FIG. 3, FIG. 4, FIG. 6, and FIG. 7, dashed lines are merely used to represent a boundary between the first display area 21 and the first non-display area 22 or a boundary between the second display area 11 and the second non-display area 12. The lines are not present in an actual product.

The display device and the method for preparing same provided in the embodiments of the present disclosure are described in detail above. The principles and implementations of the present disclosure are described by using specific examples in this specification, and the descriptions of the foregoing embodiments are merely used for helping understand the present disclosure. Meanwhile, a person of ordinary skill in the art can make modifications to the specific implementations and application range according to the ideas of the present disclosure. In conclusion, the content of the specification is not to be construed as a limitation to the present disclosure.

What is claimed is:

1. A display device, comprising a display panel and a packaging cover plate that are disposed opposite to each other, wherein the display panel comprises a first display area and a first non-display area disposed on a periphery of the first display area, the packaging cover plate comprises a second display area and a second non-display area disposed on a periphery of the second display area, the first display area corresponds to the second display area, the first non-display area corresponds to the second non-display area, a groove is provided in the second non-display area and is defined in a top surface of the packaging cover plate away from the display panel, and a light-shielding layer is disposed in the groove;

wherein a top surface of the light-shielding layer is flush with the top surface of the packaging cover plate in which the groove is defined;

wherein a polarizer is disposed on the top surface of the packaging cover plate and covers the groove such that the light-shielding layer in the groove is sandwiched and disposed securely between the packaging cover plate and the polarizer;

wherein the groove has two opposite inner sidewalls and an inner bottom wall formed between the sidewalls, and the inner sidewalls and the inner bottom wall of the groove contact and cooperatively encompass the light-shielding layer;

wherein the inner sidewalls and the inner bottom wall of the groove form a U-shaped cross-section, each of the inner sidewalls is a closed-loop structure, and the inner bottom wall is a closed-loop structure.

2. The display device as claimed in claim 1, wherein the display panel is an organic light-emitting diode (OLED) display panel.

3. The display device as claimed in claim 1, wherein the groove is provided around the second display area to form a closed-loop structure.

4. The display device as claimed in claim 1, wherein an absolute value of a height difference between a top surface of the light-shielding layer and a surface of a side of the groove provided on the packaging cover plate is less than 5 μm.

5. The display device as claimed in claim 1, wherein a thickness of the packaging cover plate is in a range of 100 μm to 1000 μm, and a ratio of a depth of the groove to the thickness of the packaging cover plate is in a range of 0.01 to 0.1.

6. The display device as claimed in claim 1, wherein a distance between the groove and the second display area is in a range of 100 μm to 400 μm, and a distance between the groove and an outer edge of the second non-display area is in a range of 100 μm to 200 μm.

7. The display device as claimed in claim 1, wherein a thickness of the packaging cover plate is in a range of 500 μm to 1000 μm, and a depth of the groove is in a range of 5 μm to 30 μm.

8. The display device as claimed in claim 1, wherein a thickness of the packaging cover plate is in a range of 100 μm to 500 μm, and a depth of the groove is in a range of 5 μm to 10 μm.

9. The display device as claimed in claim 1, wherein a material of the light-shielding layer is ink or glue.

10. A method for preparing a display device, the display device being the display device as claimed in claim 1, wherein the preparation method comprises:

providing a cover plate body, wherein the cover plate body has a second display area and a second non-display area;

forming a groove in the second non-display area of the cover plate body, wherein the groove is defined in a top surface of the packaging cover plate away from the display panel;

disposing a light-shielding layer in the groove to obtain a packaging cover plate, wherein a top surface of the light-shielding layer is flush with the top surface of the packaging cover plate in which the groove is defined; and providing a display panel, and combining the packaging cover plate with the display panel to obtain a display device;

providing a polarizer, wherein the polarizer is disposed on the top surface of the packaging cover plate and covers the groove such that the light-shielding layer in the groove is sandwiched and disposed securely between the packaging cover plate and the polarizer, the groove has two opposite inner sidewalls and an inner bottom wall formed between the sidewalls, and the inner sidewalls and the inner bottom wall of the groove contact and cooperatively encompass the light-shielding layer;

wherein the inner sidewalls and the inner bottom wall of the groove form a U-shaped cross-section, each of the inner sidewalls is a closed-loop structure, and the inner bottom wall is a closed-loop structure.

11. The method for preparing a display device as claimed in claim 10, wherein the step of disposing the light-shielding layer in the groove comprises: applying glue in the groove using a glue dispenser.

12. The method for preparing a display device as claimed in claim 10, wherein the step of disposing the light-shielding layer in the groove comprises: spraying ink in the groove using an ink-jet printer.

13. The method for preparing a display device as claimed in claim 10, wherein a material of the light-shielding layer is ink or glue, and after the light-shielding layer is disposed in the groove, the method further comprises:

curing the light-shielding layer.

14. The method for preparing a display device as claimed in claim 10, wherein the display panel is an OLED display panel.

15. The method for preparing a display device as claimed in claim 10, wherein the groove is provided around the second display area to form a closed-loop structure.

16. The method for preparing a display device as claimed in claim 10, wherein an absolute value of a height difference between a top surface of the light-shielding layer and a surface of a side of the groove provided on the packaging cover plate is less than 5 μm.

17. The method for preparing a display device as claimed in claim 10, wherein a thickness of the packaging cover plate is in a range of 100 μm to 1000 μm, and a ratio of a depth of the groove to the thickness of the packaging cover plate is in a range of 0.01 to 0.1.

18. The method for preparing a display device as claimed in claim 10, wherein a distance between the groove and the second display area is in a range of 100 μm to 400 μm, and a distance between the groove and an outer edge of the second non-display area is in a range of 100 μm to 200 μm.

19. The method for preparing a display device as claimed in claim 10, wherein a thickness of the packaging cover plate is in a range of 500 μm to 1000 μm, and a depth of the groove is in a range of 5 μm to 30 μm; or a thickness of the packaging cover plate is in a range of 100 μm to 500 μm, and a depth of the groove is in a range of 5 μm to 10 μm.

20. The method for preparing a display device as claimed in claim 10, wherein a material of the light-shielding layer is ink or glue.

* * * * *